US00RE45282E

(19) United States
(12) Reissued Patent
Fossum et al.

(10) Patent Number: US RE45,282 E
(45) Date of Reissued Patent: *Dec. 9, 2014

(54) METHOD AND APPARATUS FOR OPERATING A CMOS IMAGER HAVING A PIPELINED ANALOG TO DIGITAL CONVERTER

(75) Inventors: Eric R. Fossum, Wolfeboro, NH (US); Sandor L. Barna, Los Altos, CA (US)

(73) Assignee: Round Rock Research, LLC, Parsippany, NJ (US)

( * ) Notice: This patent is subject to a terminal disclaimer.

(21) Appl. No.: 13/357,118

(22) Filed: Jan. 24, 2012

Related U.S. Patent Documents

Reissue of:
(64) Patent No.: 6,909,392
Issued: Jun. 21, 2005
Appl. No.: 10/694,759
Filed: Oct. 29, 2003

U.S. Applications:
(60) Continuation of application No. 12/827,288, filed on Jun. 30, 2010, now abandoned, which is a division of application No. 11/812,785, filed on Jun. 21, 2007, now Pat. No. Re. 41,519, which is an application for the reissue of Pat. No. 6,909,392, which is a continuation of application No. 10/061,938, filed on Oct. 25, 2001, now Pat. No. 6,646,583.

(60) Provisional application No. 60/243,324, filed on Oct. 25, 2000.

(51) Int. Cl.
*H03M 1/34* (2006.01)

(52) U.S. Cl.
USPC ..... 341/162; 341/120; 341/144; 341/155; 348/308; 348/254; 348/E5.034; 348/E3.018; 348/E3.029

(58) Field of Classification Search
USPC ..... 341/120–165; 348/308, 254, E5.034, 348/E3.018, E3.029, E3.022
See application file for complete search history.

(56) References Cited

U.S. PATENT DOCUMENTS

| | | | | |
|---|---|---|---|---|
| 4,366,469 | A | 12/1982 | Michaels et al. | |
| 5,382,975 | A * | 1/1995 | Sakai et al. | 348/241 |
| 5,471,515 | A * | 11/1995 | Fossum et al. | 377/60 |
| 5,801,657 | A * | 9/1998 | Fowler et al. | 341/155 |
| 5,880,691 | A * | 3/1999 | Fossum et al. | 341/162 |
| 5,886,659 | A * | 3/1999 | Pain et al. | 341/155 |
| 5,920,274 | A * | 7/1999 | Gowda et al. | 341/155 |
| 6,124,819 | A * | 9/2000 | Zhou et al. | 341/155 |
| 6,377,303 | B2 * | 4/2002 | O'Connor | 341/155 |
| 6,456,326 | B2 | 9/2002 | Fossum et al. | |
| 6,518,907 | B2 * | 2/2003 | Tsai | 341/155 |
| 6,646,583 | B1 * | 11/2003 | Fossum et al. | 341/155 |
| 6,734,817 | B2 * | 5/2004 | Naka et al. | 341/155 |
| 6,771,202 | B2 | 8/2004 | Watanabe et al. | |

(Continued)

*Primary Examiner* — Lam T Mai
(74) *Attorney, Agent, or Firm* — Lerner, David, Littenberg, Krumholz & Mentlik, LLP

(57) ABSTRACT

[An image sensor system using offset analog to digital converters. The analog to digital converters require a plurality of clock cycles to carry out the actual conversion. These conversions are offset in time from one another, so that at each clock cycle, new data is available.] *A system includes a CMOS active pixel image sensor having an array for photoreceptors to convert an image into an analog signal. The CMOS image sensor converts the analog signal into a digital signal using a pipelined analog to digital converter.*

6 Claims, 4 Drawing Sheets

(56) References Cited

U.S. PATENT DOCUMENTS

| | | | | |
|---|---|---|---|---|
| 6,816,196 | B1 | 11/2004 | Mann | |
| 7,283,080 | B2 | 10/2007 | Kirsch | |
| 7,313,380 | B2 * | 12/2007 | Yamaji | 455/264 |
| RE41,730 | E | 9/2010 | Fossum et al. | |
| RE42,117 | E * | 2/2011 | Fossum et al. | 341/162 |
| RE42,918 | E | 11/2011 | Fossum et al. | |
| RE42,974 | E | 11/2011 | Fossum et al. | |
| 2004/0041927 | A1 | 3/2004 | Cho et al. | |
| 2007/0223626 | A1 * | 9/2007 | Waxman | 375/316 |
| 2008/0218621 | A1 | 9/2008 | Cho et al. | |

* cited by examiner

METHOD AND APPARATUS FOR OPERATING A CMOS IMAGER HAVING A PIPELINED ANALOG TO DIGITAL CONVERTER

Matter enclosed in heavy brackets [ ] appears in the original patent but forms no part of this reissue specification; matter printed in italics indicates the additions made by reissue.

*More than one reissue application has been filed for the reissue of U.S. Pat. No. 6,909,392. The reissue applications are U.S. patent application Ser. Nos. 11/896,441, 11/812,785, 11/896,442, 12/878,368, 12/827,288, 13/357,118, and 13/532,165, U.S. patent application Ser. No. 11/896,441, which was filed on Aug. 31, 2007, which issued on Feb. 8, 2011 as U.S. Pat. No. Re. 41,227, is a reissue of U.S. Pat. No. 6,909,392, U.S. application Ser. No. 13/532,165, which was filed on Jun. 25, 2012 is a continuation of U.S. patent application Ser. No. 12/878,368, which was filed on Sep. 9, 2010 and is now abandoned, is a continuation of U.S. patent application Ser. No. 11/896,442, which was filed on Aug. 31, 2007, which issued as U.S. Pat. No. Re. 41,730 on Sep. 21, 2010, which is continuation of U.S. patent application Ser. No. 11/812,785, which was filed on Jun. 21, 2007, which issued as U.S. Pat. No. Re. 41,519 on Aug. 17, 2010, which was a reissue of U.S. of U.S. Pat. No. 6,909,382. The reissue application U.S. patent application Ser. No. 13/357,118, which was filed on Jan. 24, 2012, is a continuation of U.S. patent application Ser. No. 12/827,288, which was filed on Jun. 30, 2010, which is now abandoned, which is a divisional of U.S. patent application Ser. No. 11/812,785, which was filed on Jun. 21, 2007, which issued on Aug. 17, 2010, which is a reissue of U.S. Pat. No. 6,909,382.*

CROSS-REFERENCE TO RELATED APPLICATIONS

This [application] *is a Continuation Reissue Application. More than one reissue application has been filed for the reissue of U.S. Pat. No. 6,909,392. The reissue applications are U.S. patent application Ser. Nos. 11/896,441, 11/812,785, 11/896,442, 12/878,368, 12/827,288, 13/532,165 and 13/357,118 (the present application). The present application, U.S. patent application Ser. No. 13/357,118, which was filed on Jan. 24, 2012, is a continuation of U.S. patent application Ser. No. 12/827,288, which was filed on Jun. 30, 2010, which is now abandoned, which is a divisional of U.S. patent application Ser. No. 11/812,785, which was filed on Jun. 21, 2007, which issued on Aug. 17, 2010 as U.S. Pat. No. Re. 41,519, which is a reissue of U.S. Pat. No. 6,909,392. U.S. patent application Ser. No. 11/896,441, which was filed on Aug. 31, 2007, issued on Jan. 19, 2011 as U.S. Pat. No. Re. 42,117, is a reissue of U.S. Pat. No. 6,909,392. U.S. application Ser. No. 13/532,165 was filed on Jun. 25, 2012 and is a continuation of U.S. application Ser. No. 12/878,368, which was filed on Sep. 9, 2010 and is now abandoned, which is a continuation of U.S. patent application Ser. No. 11/896,442, which was filed on Aug. 31, 2007 and which issued as U.S. Pat. No. Re. 41,730 on Sep. 21, 2010, which is also a reissue of U.S. Pat. No. 6,909,392 which was filed as U.S. patent application Ser. No. 10/694,759 on Oct. 29, 2003 and issued on Jun. 21, 2005, which* is a continuation of application Ser. No. 10/061,938, *which was* filed *on* Oct. 25, 2001 [(scheduled to issue as U.S. Pat. No. 6,646,583 on Nov. 11, 2003)], *which issued on Nov. 11, 2003 as U.S. Pat. No. 6,646,583*, which claims priority from provisional Application No. 60/243,324 *which was* filed *on* Oct. 25, 2000. The subject matter of applications Ser. Nos. 10/061,938 and 60/243,324 are hereby incorporated by reference.

BACKGROUND

The basic operation of a CMOS active pixel sensor is described in U.S. Pat. No. 5,471,215. This kind of image sensor, and other similar image sensors, often operate by using an array of photoreceptors to convert light forming an image, into signals indicative of the light, e.g. charge based signals. Those signals are often analog, and may be converted to digital by an A/D converter. Image sensors which have greater numbers of elements in the image sensor array may produce more signals. In order to handle these signals, either more A/D converters must be provided, or the existing A/D converters need to digitize the data from these image sensors at higher signal rates. For example, a high precision CMOS active pixel sensor may require an A/D converter which is capable of 10 bits of resolution at 20 Megasamples per second.

Image sensors of this type are often limited by the available area or "real estate" on the chip, a and the available power for driving the chip. An advantage of using CMOS circuitry is that power consumption of such a circuit may be minimized. Therefore, the power consumption of such a circuit remains an important criteria. Also, since real estate on the chip may be limited, the number of A/D converters and their size should be minimized.

A/D converters with this kind of resolution, in the prior art, may have a power consumption of about 25 mw using a 3.3 volt power supply.

SUMMARY

The present application describes a system, and a special A/D converter using individual successive approximation A/D converter cells which operate in a pipelined fashion.

BRIEF DESCRIPTION OF THE DRAWINGS

These and other aspects will now be described in detail with reference to the accompanying drawings, wherein.

DETAILED DESCRIPTION

Figure 1:
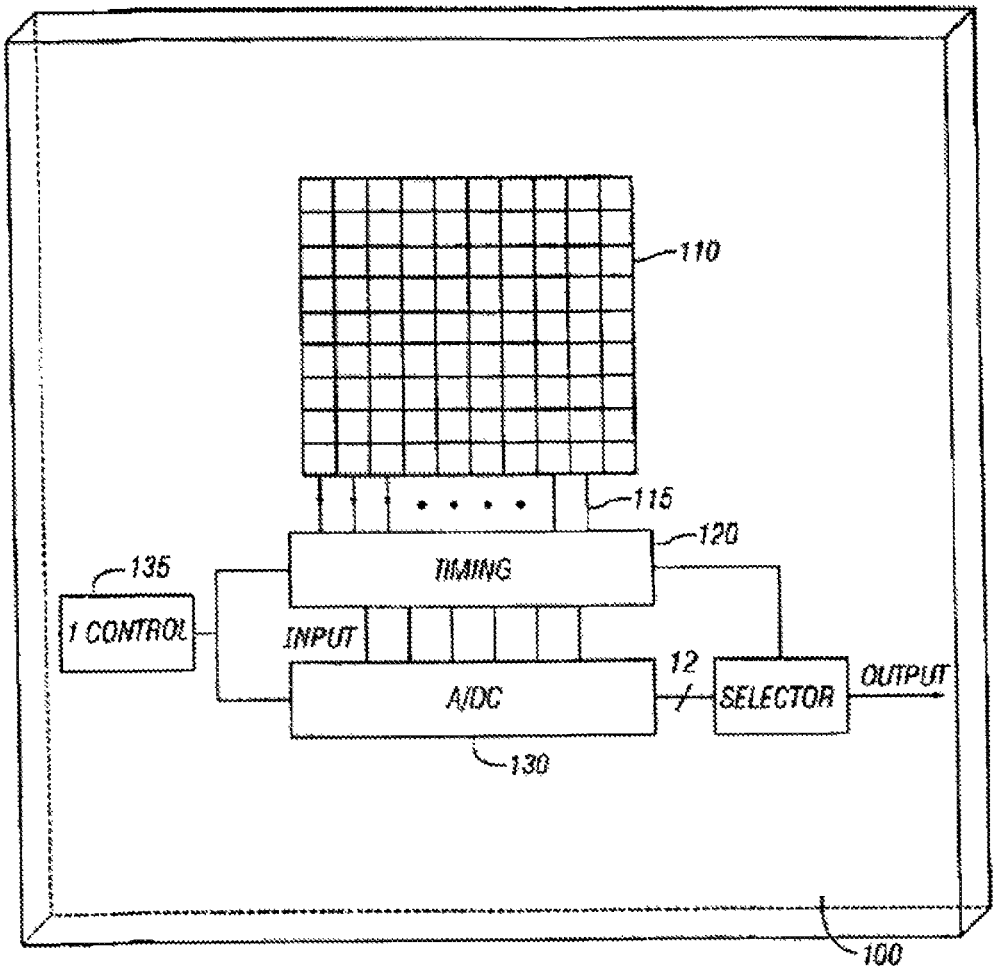
FIG. 1 shows a block diagram of a circuit on a chip including an image sensor and A/D converter.

According to the present system, a plurality of successive approximation A/D converter cells are provided. The embodiment recognizes that the pixel analog data is arriving at a relatively high rate, e.g. 20 Mhz. A plurality of A/D converters are provided, here twelve A/D converters are provided, each running at 1.6 megasamples per second. The timing of these A/D converters are staggered so that each A/D converter is ready for its pixel analog input at precisely the right time. The power consumption of such cells is relatively low; and therefore the power may be reduced.

In the embodiment, an A/D converter with 10 bits of resolution and 20 megasamples per second is provided that has a power consumption on the order of 1 mW. Twelve individual successive approximation A/D converter cells are provided. Each requires 600 ns to make each conversion. Since twelve stages are necessary, the total data throughput equals twelve/600 ns=20 megasamples per second. Each successive approximation A/D converter requires 12 complete clock cycles to convert the 10 bit data. The first clock cycle samples the input data, then 10 clock cycles are used to convert each of the bits. A single clock cycle is used for data readout.

A block diagram is shown in FIG. 1. FIG. 1 shows how a single chip substrate 100 includes a photo sensor array 110. Photosensor array 110 can be an array of, for example, photodiodes, photogates, or any other type of photoreceptors. The output 115 of the array 110 is coupled to a timing circuit 120 which arranges the *analog* data to be sent to the A/D converter array 130. The *analog* data is sent *via an INPUT* such that each A/D converter receives data at a different, staggered time. *Digital signals corresponding to the input analog signals are outputted via an OUTPUT. A control circuit 135 is coupled to the INPUT, the A/D converter, and the OUTPUT.*

Figure 2:
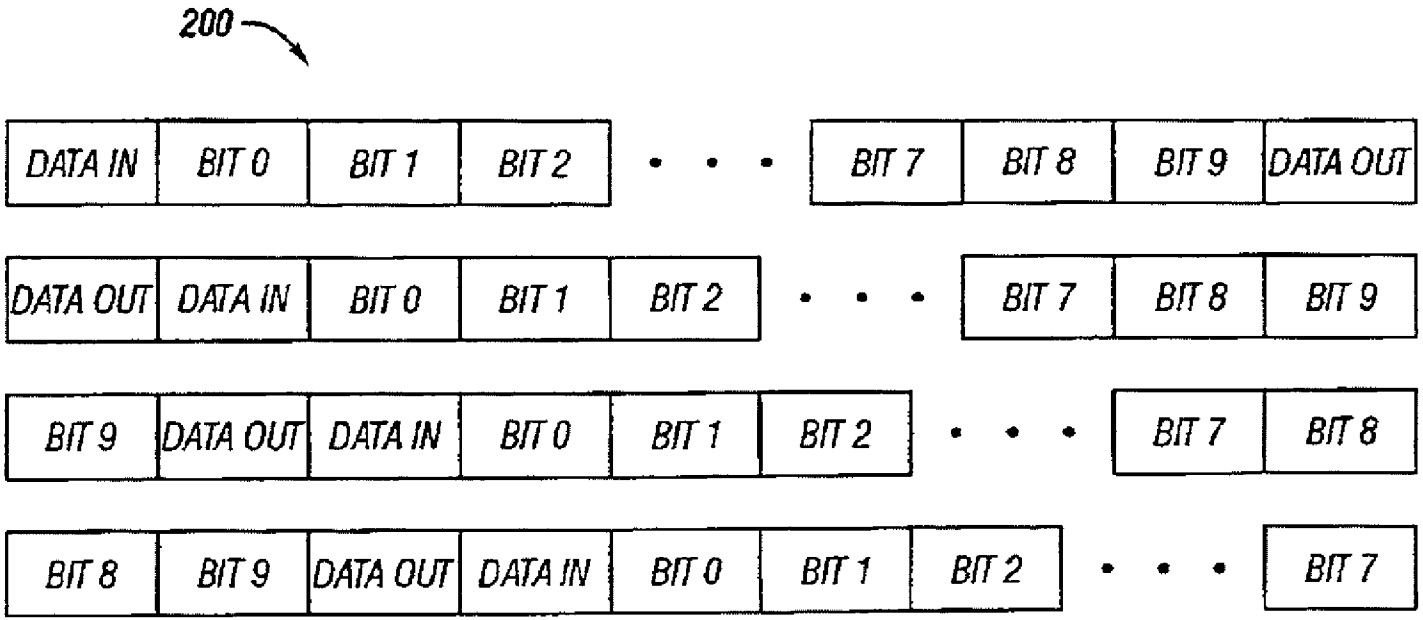
FIG. 2 shows relative timing of A/D converter cells.

FIG. 2 shows how the timing and switching of the data is carried out. The input signals from the image sensor array 110 are staggered and provided to the A/D converters at different times, preferably one clock cycle apart. FIG. 2 shows the relative timing of four of the twelve A/D converter cells. The first row 200 for example may represent the first A/D converter. Data that is input during cycle No. 1 is available at the output of the A/D converter during cycle No. 12. Different data from different ones of the converters are output in each cycle.

Figure 3:
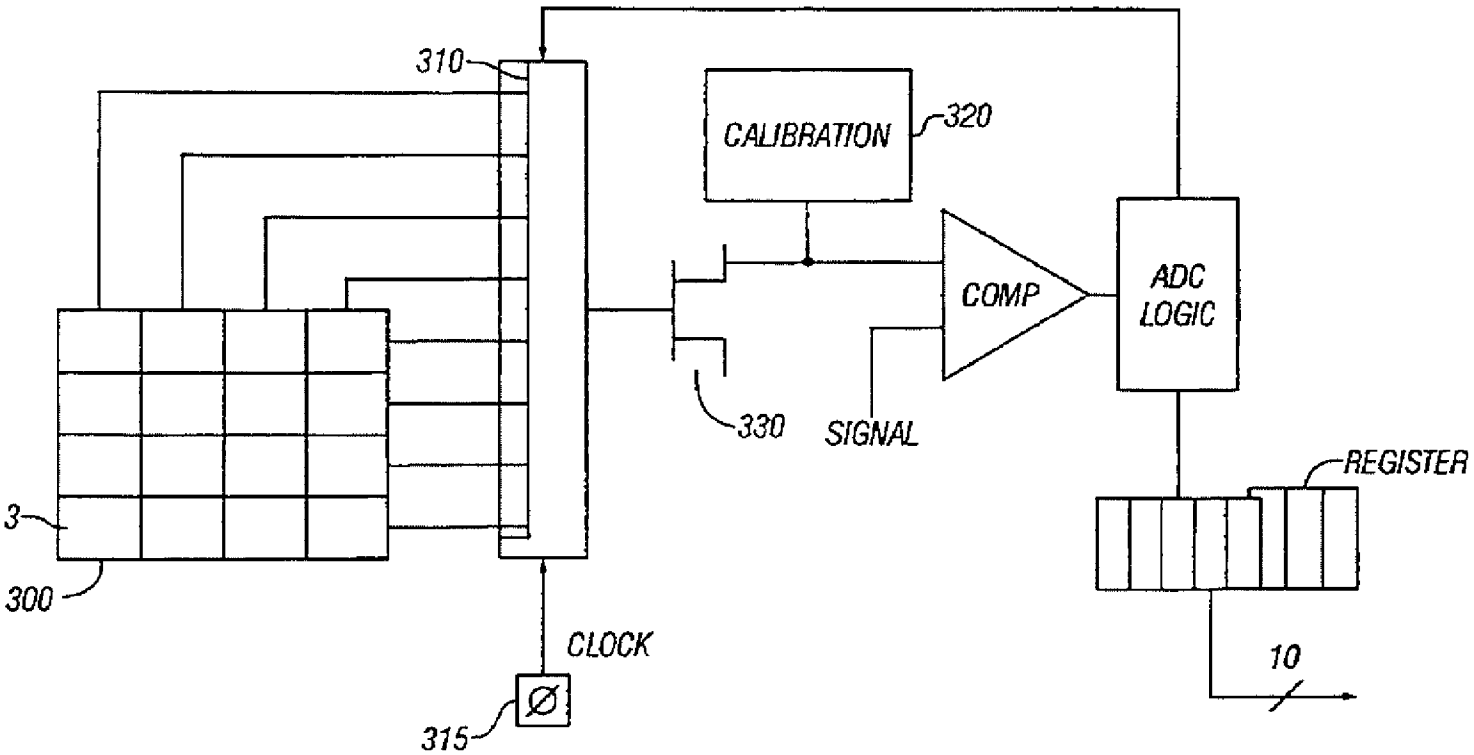
FIG. 3 shows an embodiment with built-in calibration in the system.

FIG. 3 shows a block diagram of each of the twelve A/D converter elements. The elements may operate using capacitors formed by a capacitor array 300. In this embodiment, unit cell capacitors are formed. The capacitor array 300 is formed, for example, of N different elements, each of which are identical. Matching each of these capacitors may ensure linearity. A switching element 310 may switch the capacitor combinations in the proper way to convert a specific bit. As conventional in a successive approximation A/D converter, different bits are obtained and output during different clock cycles. Hence the clock input at 315 may select the different bits which are used and may hence select the number of the capacitor elements which are used.

This system may adaptively assign the channels to A/D converters in a different way than conventional. Conventional methods of removing fixed patterned noise, therefore, might not be as effective. Therefore, it becomes important that these A/D converters have consistent characteristics. In this embodiment, calibration may be used to compensate for offsets between the comparators of the system.

Successive approximation A/D converters as used herein may have built-in calibration shown as elements 320. Any type of internal calibration system may be used.

The inventors also realize that comparator kickback noise may become a problem within this system. That comparator itself may produce noise which may affect the signal being processed. In this embodiment, a single preamplifier, here shown as a follower 330, is introduced between the signal and the comparator.

This system also requires generation of multiple timing and control signals to maintain the synchronization. Each successive approximation A/D converter requires about 20 control signals. The timing is offset for each of the twelve different A/D converters. Therefore, digital logic is used to replicate control signals after a delay.

Figure 4A:
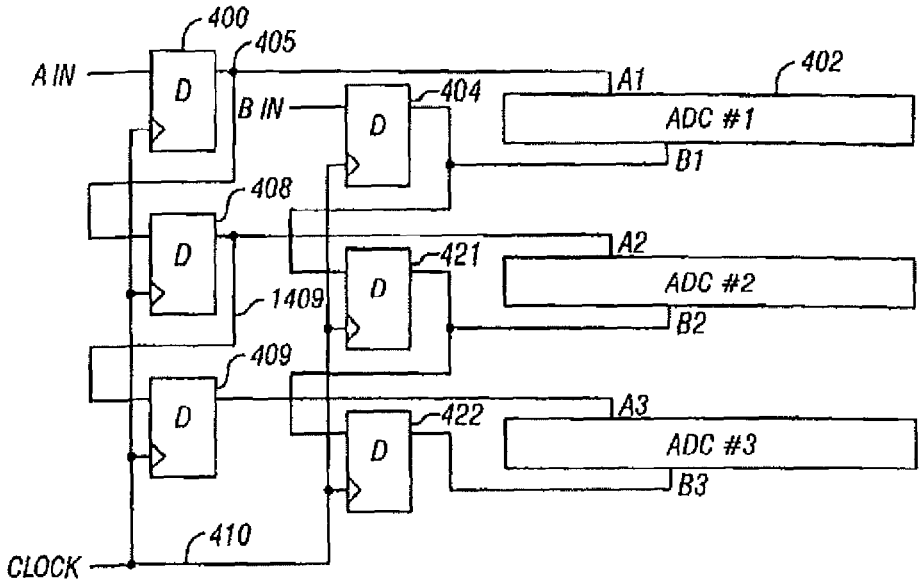
FIGS. 4A and 4B show two alternative schemes for implementing the A/D converter timing and control.

In one embodiment, shown in FIG. 4A, a plurality of flip-flops, here D type flip-flops, are used to delay the respective signals. In FIG. 4A, the control signals showed as A in and B in are separately delayed using a series of flip-flops; with A in delayed by flip-flops 400, 408, 409; and B in delayed by flip-flops 404, 421, 422. For example, the control signal A in is delayed by flip-flop 400 to produce signal A1, line 405, which is the first control signal for the first A/D converter 402. Similarly, the B in control signal is delayed by flip-flop 404 to produce the B1 control signal for the A/D converter 402. The A1 signal 405 also drives the input of the second D flip-flop 408. The output of flip-flop 408 similarly drives flip-flop 409 and the like. Each successive output such as 405 is then delayed by the next flip-flop 408, and used as the respective second control (here A2, B2) for the A/D converters.

Each cycle of the A/D converter may require finer timing than can be offered by a usual clock. Hence, the clock input 410 may be a divided higher speed clock.

Two D type flip-flops are required to delay each signal. Any signal which is only half a clock cycle in length may require falling edge flip-flops, in addition to the rising edge flip-flops, and may also require additional logic.

Figure 4B:
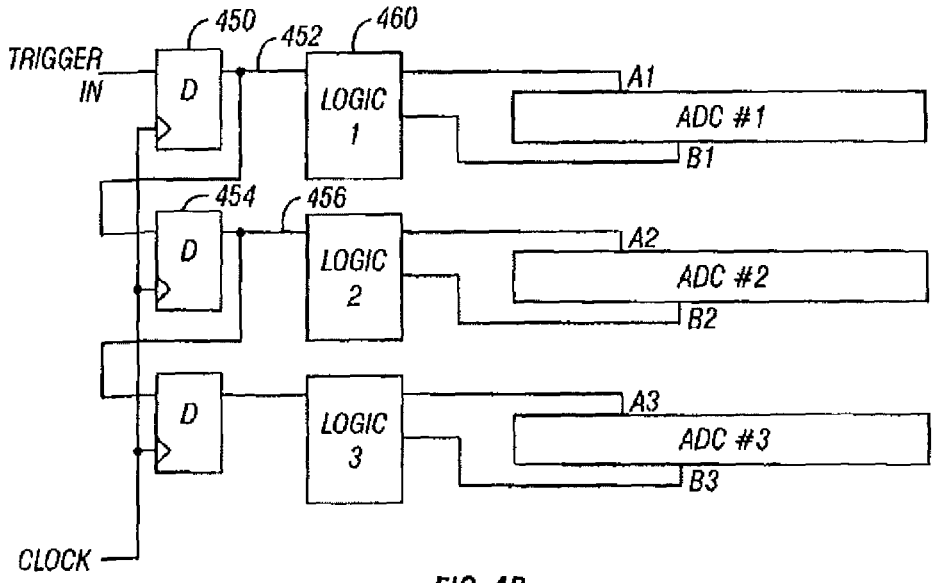

FIG. 4B shows an A/D converter cell with a trigger signal that is staggered by one or two flip-flops according to the master clocks. All of the local control signals may be generated locally within the A/D converter. Delayed versions of the clock are still obtained. For example, the D type flip-flops 450 produces a delayed version 452. Delayed version 452 triggers the next the flip-flop 454 to produce delayed version 456. Each of the delayed versions, such as 452, is further processed by the logic block 460. Logic block for 60 outputs the two control signals A1 and B1. For example, the control signal A1 may be output directly, with control signal B1 being delayed by a series of logic gates or transistors. Since this system uses fewer flip-flops, and only a single input signal, it may allow for improved symmetry between the A/D converters.

Although only a few embodiments have been disclosed in detail above, other modifications are possible. For example, different logic techniques may be used herein. In addition, while the above describes specific numbers of bits, the same techniques are applicable to other numbers of elements. For example, this system may be used with as few as three elements, with the three successive approximation devices staggered to receive one out of every three inputs.

The above has described matched unit cell capacitors, but it should also be understood that other capacitors could be used. Conventional capacitors which are not matched in this way can be used. In addition, the capacitors can be scaled relative to one another by some amount, e.g. in powers of two.

All such modifications are intended to be used within the following claims.

What is claimed is:

[1. An analog-to-digital (A/D) converter, comprising:

an input, for receiving a series of analog signals;

an output, for outputting a series of digital signals respectively corresponding to said series of analog signals;

a plurality of A/D cells, each of said A/D cells for converting one of said series of analog signals to a corresponding one of said series of digital signals; and a control circuit, coupled to said input, said output, and said plurality of A/D cells;

wherein said control circuit operates said input, said output, and said plurality of A/D cells so that each successive A/D cell is assigned, at a different time, to convert a different one of each successive analog signal from said series of analog signals to a corresponding digital signal in said series of digital signals.]

[2. The analog-to-digital converter of claim 1, wherein said different time correspond to a different period of a clock signal provided to said analog-to-digital converter.]

[3. The analog-to-digital converter of claim 1, wherein each of said A/D cells further comprises a calibration element, said calibration element being set so that each A/D cell coverts the same analog signal present at said input to a same digital value at said output.]

[4. The analog-to-digital converter of claim 1, wherein each of said A/D cells further comprises a noise suppression element.]

[5. The analog-to-digital converter of claim 4, wherein said noise suppression element comprises a transistor.]

[6. The analog-to-digital converter of claim 1, wherein each A/D cell performs an A/D conversion in a same amount of time.]

[7. The analog-to-digital converter of claim 1, wherein each A/D cell performs an A/D conversion using successive approximation.]

[8. The analog-to-digital converter of claim 1, wherein said control circuit operates to cause said analog-to-digital converter to begin converting a different one of said series of analog signals on each of a series of successive clock signals.]

[9. The analog-to-digital converter of claim 1, wherein said control circuit operates to cause said analog-to-digital converter to output a series of digital signals on each of a series of successive clock signals.]

[10. A method for converting a series of analog signals to a corresponding series of digital signals, comprising:

receiving over a period of time, a series of analog signals;

assigning each analog signal from said series of analog signals as they are received to an available A/D cell for analog-to-digital conversion to a corresponding digital signal; and outputting a different digital signal corresponding to a respective analog signal from said series of analog signals as each A/D cell finishes its analog-to-digital conversion;

wherein at least two A/D cells are performing respective analog-to-digital conversions while another A/D cell outputs one of said digital signals.]

[11. The method of claim 10, further comprising:

calibrating each A/D cell so that an analog-to-digital conversion performed on a same analog signal by any A/D cell results in a same digital signal.]

[12. The method of claim 10, wherein said step of assigning comprises a step of suppressing comparator kickback noise during said analog-to-digital conversion.]

[13. The method of claim 10, wherein each A/D cell performs an analog-to-digital conversion in a same amount of time.]

[14. The method of claim 10, wherein each A/D cell perform an analog-to-digital conversion using successive approximation.]

*15. A camera having a lens to receive and focus light, the camera further comprising:*

*an array of photoreceptors of a CMOS active pixel sensor to convert the focused light into a plurality of staggered in time analog signals;*

*an analog to digital (A/D) converter comprising a plurality of A/D converter cells; and*

*a controller to assign a respective analog signal of the plurality of staggered in time analog signals to a respective A/D converter cell of the plurality of A/D converter cells at staggered times that are offset from each other, wherein at least one of the plurality of A/D converter cells is configured to convert its respective analog signal to a respective digital signal during a time period that is staggered from at least one other of the plurality of A/D converter cells.*

*16. The camera of claim 15, wherein the respective digital signal comprises at least a respective first bit.*

*17. The camera of claim 16, wherein the respective digital signal comprises ten bits.*

*18. The camera of claim 15, wherein each of the plurality of A/D converter cells is a successive approximation A/D converter cell.*

*19. The camera of claim 18, wherein the staggered times are offset by one clock cycle.*

*20. The camera of claim 15, wherein the staggered times are offset by one clock cycle.*

* * * * *